United States Patent
Asakawa et al.

(10) Patent No.: US 12,353,131 B2
(45) Date of Patent: Jul. 8, 2025

(54) METHOD FOR MANUFACTURING INDIUM-CONTAINING ORGANIC POLYMER FILM, PATTERNING METHOD, AND METHOD FOR MANUFACTURING SEMICONDUCTOR DEVICE

(71) Applicant: Kioxia Corporation, Tokyo (JP)

(72) Inventors: Koji Asakawa, Kanagawa (JP);
Norikatsu Sasao, Kanagawa (JP);
Shinobu Sugimura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 813 days.

(21) Appl. No.: 17/675,770

(22) Filed: Feb. 18, 2022

(65) Prior Publication Data

US 2023/0086850 A1 Mar. 23, 2023

(30) Foreign Application Priority Data

Sep. 21, 2021 (JP) .................. 2021-153437

(51) Int. Cl.
*G03F 7/039* (2006.01)
*C08L 85/00* (2006.01)
*G03F 7/32* (2006.01)

(52) U.S. Cl.
CPC ............ *G03F 7/0392* (2013.01); *C08L 85/00* (2013.01); *G03F 7/325* (2013.01)

(58) Field of Classification Search
CPC ................... G03F 7/325; C08L 85/00
See application file for complete search history.

(56) References Cited

U.S. PATENT DOCUMENTS

| | | | |
|---|---|---|---|
| 2018/0348128 A1 * | 12/2018 | Zheng | G03F 7/70025 |
| 2020/0291155 A1 | 9/2020 | Sasao et al. | |
| 2020/0291156 A1 | 9/2020 | Asakawa et al. | |
| 2021/0296116 A1 | 9/2021 | Asakawa et al. | |

FOREIGN PATENT DOCUMENTS

| | | | | |
|---|---|---|---|---|
| JP | S61-050903 B2 | 11/1986 | | |
| JP | S61-261235 A | 11/1986 | | |
| JP | 2013-225625 A | 10/2013 | | |
| JP | 2014-003276 A | 1/2014 | | |
| JP | 2014-003284 A | 1/2014 | | |
| JP | 2016-043298 A | 4/2016 | | |
| JP | 2021-048257 A | 3/2021 | | |
| KR | 2018069570 A | * | 6/2018 | G03F 7/004 |

OTHER PUBLICATIONS

English translation of KR 2018-069570 A; Kim Jae Il; Published: Jun. 25, 2018 (Year: 2018).*

(Continued)

*Primary Examiner* — Mark F. Huff
*Assistant Examiner* — Richard David Champion
(74) *Attorney, Agent, or Firm* — Foley & Lardner LLP

(57) ABSTRACT

A method for manufacturing an indium-containing organic polymer film includes forming an organic polymer film on a base body, infiltrating the organic polymer film with an alkylindium having an alkyl group having 2 to 4 carbon atoms, and oxidizing the organic polymer film infiltrated with the alkylindium.

20 Claims, 8 Drawing Sheets

(56) References Cited

OTHER PUBLICATIONS

R. Z. Waldman, et al., "Sequential Infiltration Synthesis of Electronic Materials: Group 13 Oxides via Metal Alkyl Precursors" Pritzker School of Molecular Engineering, The University of Chicago, Chicago, Illinois 60637, United States, Chemical Sciences and Engineering Division, Materials Science Division, and Center for Molecular Engineering, Argonne National Laboratory, Lemont, Illinois 60439, United States, Advanced Materials for Energy-Water Systems (AMEWS) Energy Frontier Research Center (EFRC), Lemont, Illinois 60439, United States, Chemistry of Materials, 2019, 31, pp. 5274-5285; URL: http://pubs.acs.org/action/showCitFormats?doi=10.1021/acs.chemmater.9b01714; 12 pages.
R. Z. Waldman, et al., "The chemical physics of sequential infiltration synthesis—A thermodynamic and kinetic perspective", Journal of Chemical Physics, 151, 190901, 2019; URL: https://doi.org/10.1063/1.5128108; 26 pages.

\* cited by examiner

[CHEMICAL FORMULA 1]

[CHEMICAL FORMULA 2]

METHOD FOR MANUFACTURING INDIUM-CONTAINING ORGANIC POLYMER FILM, PATTERNING METHOD, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-153437, filed Sep. 21, 2021, the entire contents of which are incorporated herein by reference.

FIELD

Embodiments described herein relate generally to a method for manufacturing an indium-containing organic polymer film, a patterning method, and a method for manufacturing a semiconductor device.

BACKGROUND

The development of a semiconductor device with a three-dimensional structure has proceeded, and a technique for forming a pattern with a high aspect ratio is increasingly desired. Since a mask pattern used in a process for the technique is exposed to an etching gas for an extended period, resistance to the etching gas is required for the mask pattern. For example, when a fluorocarbon gas is used as an etching gas, high etching resistance to a fluoride radical is required. Furthermore, a method for manufacturing a metal-containing organic polymer film used for an etching mask of such a mask pattern is required.

DETAILED DESCRIPTION

Embodiments provide a method for manufacturing an indium-containing organic polymer film used for an etching mask and the like, a patterning method capable of enhancing etching resistance of the etching mask to a fluoride radical, and a method for manufacturing a semiconductor device.

In general, according to at least one embodiment, a method for manufacturing an indium-containing organic polymer film includes forming an organic polymer film on a base body, infiltrating the organic polymer film with an alkylindium having an alkyl group having 2 to 4 carbon atoms, and oxidizing the organic polymer film infiltrated with the alkylindium.

Hereinafter, a method for manufacturing an indium (In)-containing organic polymer film (metal-containing organic polymer film), a patterning method, and a method for manufacturing a semiconductor device of embodiments will be described with reference to the drawings. In each embodiment, substantially the same elements are denoted by the same reference symbols, and description thereof may be partially omitted. The drawings are schematic, and relationships between thicknesses and plane dimensions, ratios of thicknesses of portions, and the like may differ from the actual relationships and ratios.

Figure 1A:
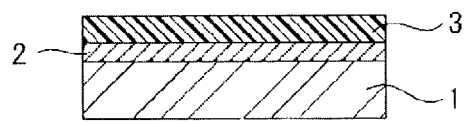
FIGS. 1A to 1E are views illustrating steps of a patterning method of at least one embodiment.

Method for Manufacturing Indium-Containing Organic Polymer Film and Patterning Method A method for manufacturing an indium-containing organic polymer film and a patterning method of at least one embodiment will be described with reference to FIGS. 1A to 1E. FIGS. 1A to 1E are cross-sectional views illustrating steps of the patterning method of at least one embodiment. In the patterning method illustrated in FIGS. 1A to 1E, a film to be processed 2 formed on a substrate 1 is prepared, and an etching mask 3 is formed on the film to be processed 2 by the method for manufacturing an In-containing organic polymer film of the embodiment, as illustrated in FIG. 1A. The etching mask 3 is a film containing an In oxide manufactured by the method for manufacturing an In-containing organic polymer film of the embodiment. The film to be processed 2 is not particularly limited, and a various types of function films are used. The film manufactured by the method for manufacturing an In-containing organic polymer film of at least one embodiment is not limited to an organic polymer film containing an In oxide, may be a baked film of an In oxide or the like, and is not limited as long as it is the In oxide-containing film.

Figure 2A:
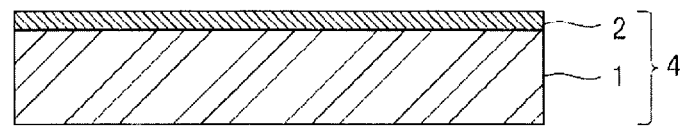
FIGS. 2A to 2D are views illustrating steps of forming an indium-containing organic polymer film of at least one embodiment.
Figure 2B:
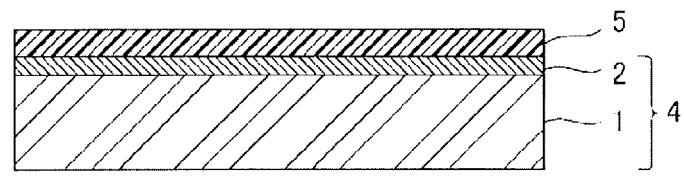

Steps of manufacturing the In oxide-containing film as the etching mask 3 will be described in detail with reference to FIGS. 2A to 2D. As illustrated in FIG. 2A, the substrate 1 having the film to be processed 2 is prepared as a base body 4. Herein, on the assumption that the metal fluoride-containing organic polymer film is used for a patterning method used in a step of manufacturing a semiconductor device and the like, the substrate 1 having the film to be processed 2 is used as the base body 4. However, when the In-containing organic polymer film and the In oxide-containing film are used for another application, the base body 4 is appropriately selected. For example, the substrate 1 is a semiconductor wafer such as a silicon substrate. As illustrated in FIG. 2B, an organic polymer film 5 is formed on the base body 4. The organic polymer film 5 is used to form an organic polymer film infiltrated with In by exposure to an organometallic compound (organic In compound) that is a precursor of infiltrating In. Herein, the infiltration of the organic polymer film 5 with the metal (In) by exposure of the organic polymer film 5 to the organometallic compound is called metallizing.

Examples of a monomer constituting an organic polymer for the organic polymer film 5 to be metallized include methacrylates containing an alkyl ester group having 1 to 12 carbon atoms, such as methyl methacrylate, ethyl methacrylate, cyclohexyl methacrylate, norbornyl methacrylate, isobornyl methacrylate, adamantyl methacrylate, and tricyclo methacrylate, phenyl methacrylate, methacrylates in which a benzyl methacrylate group is ester-bonded to methacrylic acid, naphthyl methacrylate, anthryl methacrylate, naphthyl methylmethacrylate, and methacrylate methylmethacrylate. Methacrylate may be replaced by acrylate. Additional examples include 4-vinyl benzoates containing an alkyl ester group having 1 to 12 carbon atoms, such as styrene, acetoxystyrene, vinyl benzoate, methyl-4-vinyl benzoate, butyl-4-vinyl benzoate, and cyclohexyl-4-vinyl benzoate. The monomer may be an alkyl acrylamide containing an amide group bonded to an alkyl group having 1 to 12 carbon atoms, an amide acrylate such as N-isopropylacrylamide, N-benzylacrylamide, or N-naphthylacrylamide, or the like, or an amide methacrylate thereof. Examples of the organic polymer include a novolac resin such as phenol novolac and cresol novolac, and a resole resin. The monomers may be used alone or be copolymerized. A cross-linking group such as a glycidyl group, a hydroxyl group, or a carboxyl group may be introduced.

Examples of the organic polymer include an organic polymer containing a monomer having at least one selected from an ester group ($-C(=O)-OR^1$), an amido group ($-C(=O)-NR^1R^2$), and an imido group ($-C(=O)-NR^1-C(=O)-R^2$) in one segment. In the formulae, $R^1$ and $R^2$ are the same as or different from each other, and are a hydrogen atom (—H), an alkyl group having about 1 to 5 carbon atoms ($-C_nH_{2n+1}$ wherein n is an integer of 1 to 5), or the like. At least one group selected from an ester group, an amido group, and an imido group binds to an organic In compound that is an In precursor. As a result, infiltration of the organic polymer with In is promoted. Examples of such an organic polymer include polymethyl methacrylate (PMMA), and poly(N-isopropylacrylamide) (PNIPAM). The organic polymer having at least one group (characteristic group) selected from an ester group, an amido group, and an imido group may have an aromatic ring in addition to the characteristic group. Herein, the aromatic ring is not limited to a benzene ring, and may be a polycyclic aromatic ring such as a naphthalene ring, an anthracene ring and pyrene ring. Examples of such an organic polymer include a polystyrene derivative having an aromatic ring and at least one group selected from an ester group, an amido group, and an imido group on a side chain.

Figure 2C:
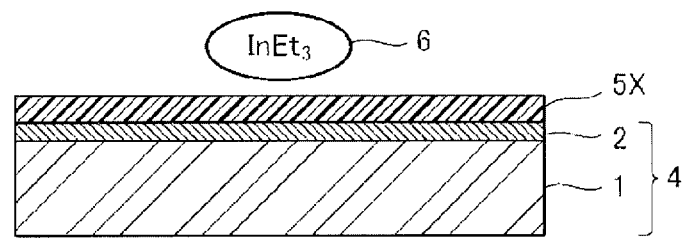

As illustrated in FIG. 2C, the organic polymer film 5 is exposed to an organic In compound 6 as a precursor of In that is an infiltrating metal, to infiltrate the organic polymer film 5 with the organic In compound 6. Thus, an In-infiltrating organic polymer film 5X is manufactured. In the exposure to the organic In compound 6, for example, a gas of the organic In compound 6 is supplied to a chamber.

Figure 3:
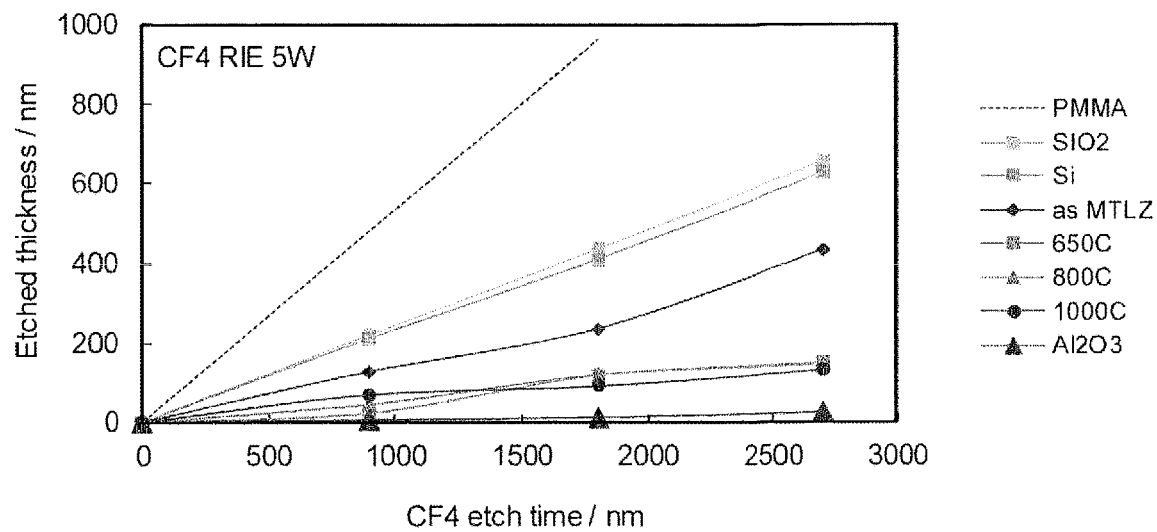
FIG. 3 is a graph illustrating a relationship between the etching time and the etching thickness of various materials.

As a metal used in metallizing, for example, aluminum (Al) is known. Among Al oxides, for example, sapphire ($\alpha$-$Al_2O_3$) has good resistance to a fluorine radical used in reactive ion etching (RIE), or the like, as illustrated in the relationship between the etching time and the etching thickness of FIG. 3. On the contrary, an Al oxide ($AlO_x$) formed by metallizing has resistance to an O radical, but does not have sufficient resistance to a fluorine radical. An In oxide ($InO_x$) formed by metallizing has better resistance to a fluorine radical than such an Al oxide formed by metallizing. Therefore, in the method for manufacturing the metal-containing organic polymer film and the patterning method of the embodiment, indium (In) is used as a metallizing metal.

As the organometallic compound that is a precursor of the metallizing metal, an alkyl metal is well known. In particular, a trimethyl metal ($M(CH_3)_3$ wherein M is a metal) is generally known as an organic compound of a group 13 metal. However, when In is used as the metal M, trimethyl indium ($In(CH_3)_3$) of alkylindiums is difficult to use safely in a step of manufacturing a semiconductor device and the like. This is because trimethyl indium is too highly reactive, and causes an explosion hazard and the like. In the manufacturing step and the patterning step of at least one embodiment, as the organometallic compound that is a precursor of In, an alkylindium having an alkyl group having 2 to 4 carbon atoms, typified by triethylindium ($In(C_2H_5)_3$) (hereinafter referred to as TEIn) is used. In addition to TEIn, examples of the alkylindium used herein include tripropylindium ($In(C_3H_7)_3$) and tributylindium ($In(C_4H_9)_3$). Provided that an alkylindium having 5 carbon atoms or more is safe, but is not suitable for a metallizing step due too poor reactivity and diffusivity.

Figure 4:
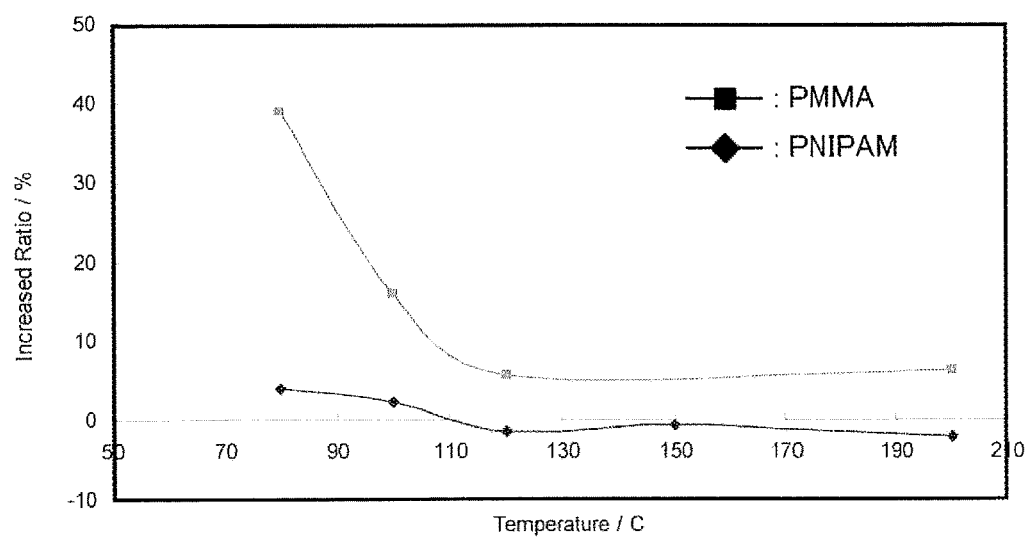
FIG. 4 is a graph illustrating an example of metallizing temperature dependency of the ratio of increased film thickness during exposure of an organic polymer to triethylindium.

The reactivity of the alkylindium having an alkyl group having 2 to 4 carbon atoms, typified by TEIn, is lower than that of trimethylindium, and therefore the alkylindium can be safely used in the step of manufacturing a semiconductor device and the like. Further, the diffusion rate of the alkylindium such as TEIn in the polymer is high, and therefore the organic polymer can be infiltrated with the alkylindium. FIG. 4 illustrates the metallizing temperature dependency of the ratio of increased film thickness of PMMA and PNIPAM after exposure as the organic polymer to TEIn. As illustrated in FIG. 4, it is shown that even when any of PMMA and PNIPAM is used, metallizing with TEIn is infiltrated more at a lower temperature. Therefore, it is preferable that metallizing with the alkylindium such as TEIn be performed at a relatively low temperature, for example, a temperature range of 60° C. to 120° C.

Figure 2D:
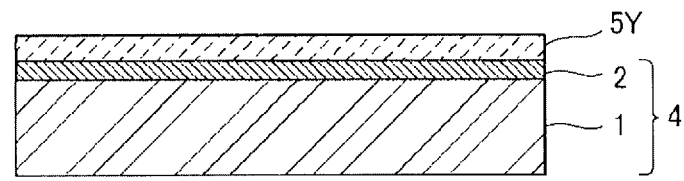

As illustrated in FIG. 2D, the organic polymer film 5X infiltrated with the alkylindium such as TEIn is then annealed, to oxidize In in the organic polymer film 5X. The annealing (oxidation) process of the In-infiltrating organic polymer film 5X is performed, for example, in water vapor ($H_2O$), oxygen ($O_2$), ozone ($O_3$), oxygen radicals, oxygen plasma, or the like. For example, when the organic polymer film 5X infiltrated with the alkylindium such as TEIn is annealed in air, In is oxidized to obtain an indium oxide ($InO_x$, and the like), but the organic polymer film 5 itself is maintained as it is. When the In-infiltrating organic polymer film 5X is annealed in oxygen, ozone, oxygen radicals, oxygen plasma, or the like, the organic polymer may be burned down. Therefore, a film 5Y after annealing (annealed film) may be a baked film of the In oxide. The annealed film 5Y of the In-infiltrating organic polymer film 5X is not limited as long as it is a film containing an In oxide. For example, the annealed film 5Y is not limited to an organic polymer film containing an In oxide, and may be a baked film of the In oxide. When the annealed film 5Y is an organic polymer film containing an In oxide, it is preferable that the content of the In oxide be 5% by mass or more.

Figure 5:
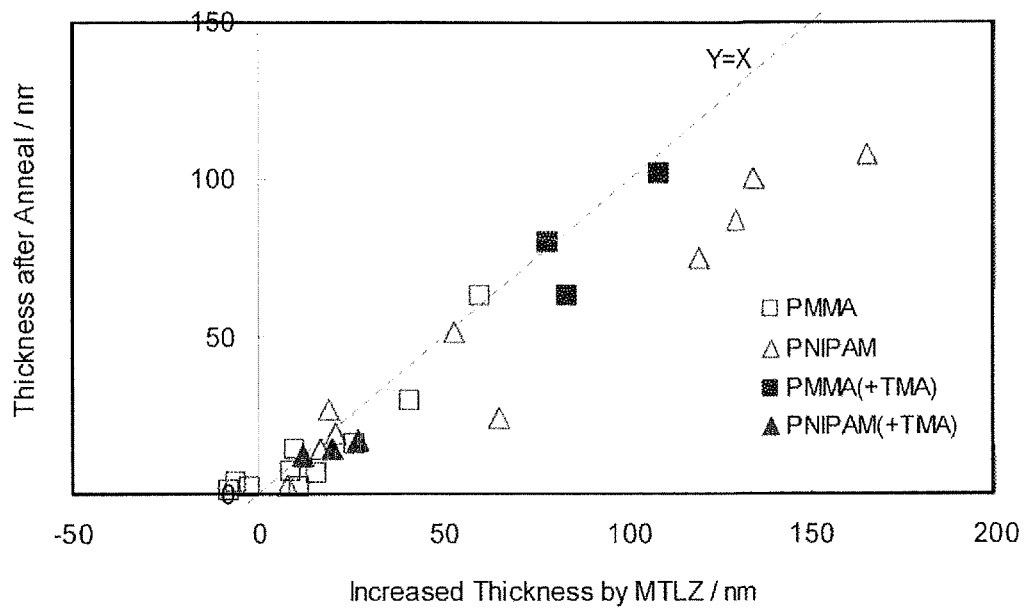
FIG. 5 is a view illustrating a relationship between the amount of increased film thickness by metallizing in use of PMMA and PNIPAM as an organic polymer and the amount of increased film thickness after annealing.
Figure 6:
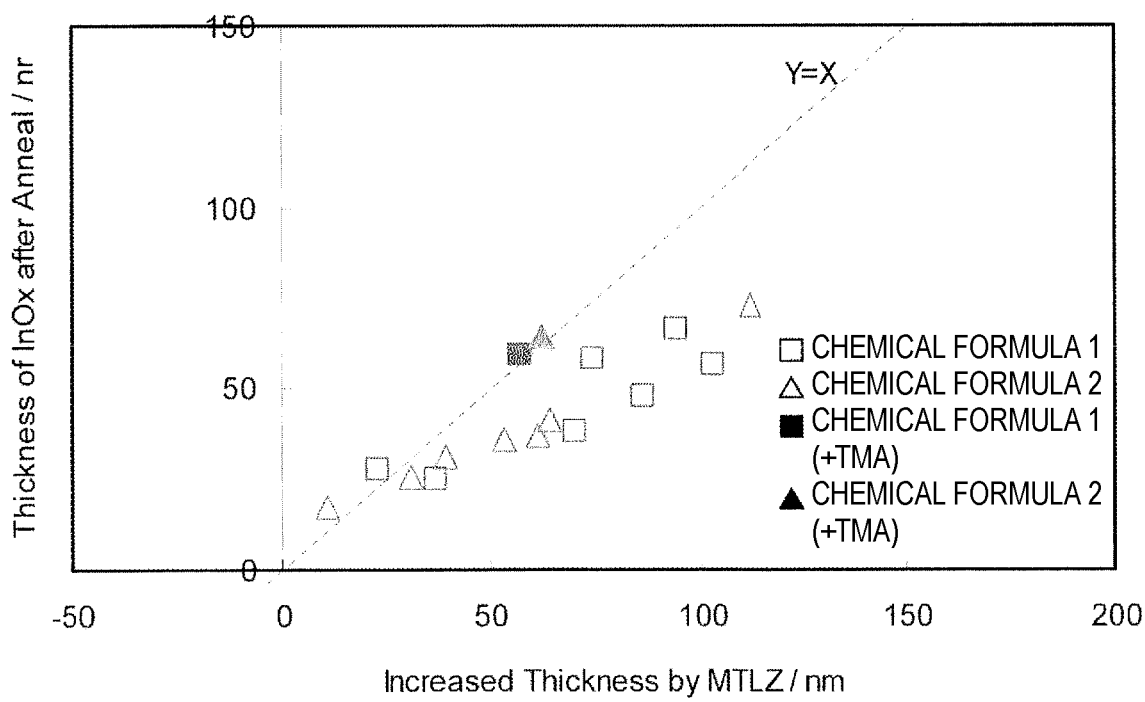
FIG. 6 is a view illustrating a relationship between the amount of increased film thickness by metallizing in use of a styrene-based resin as an organic polymer and the amount of increased film thickness after annealing.
Figure 7:
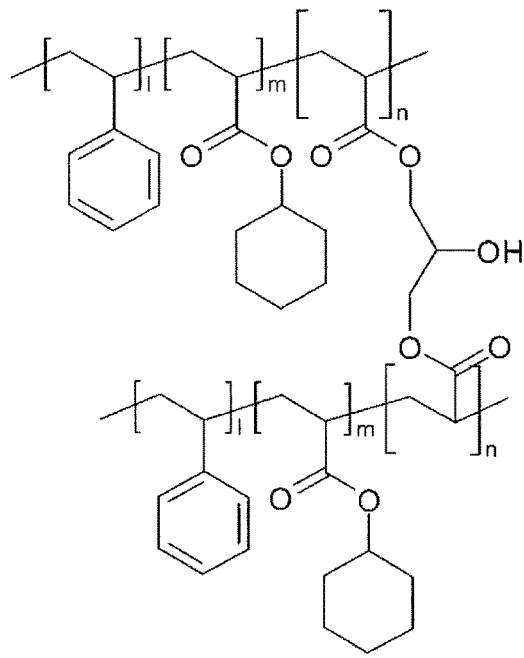
FIG. 7 is a view illustrating a structural formula of the styrene-based resin used in FIG. 6.
Figure 7:
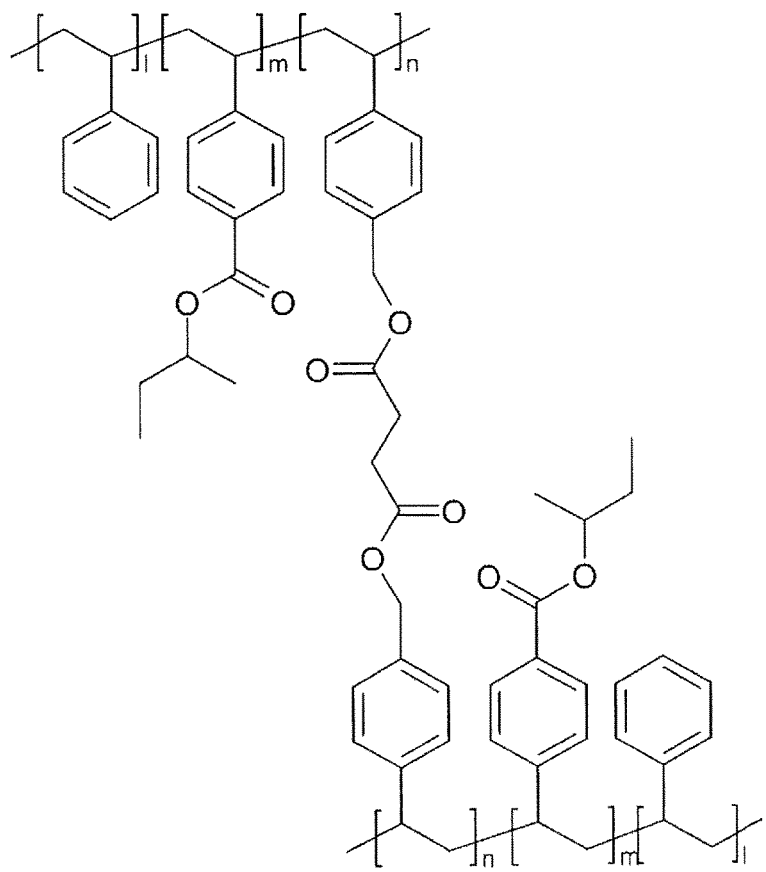

FIGS. 5 and 6 illustrate relationships between the amount of increased film thickness by metallizing and the amount of increased film thickness after annealing. FIG. 5 illustrates results when PMMA and PNIPAM are used as the organic polymer. FIG. 6 illustrates results when a styrene-based resin is used as the organic polymer. A structural formula of the styrene-based resin (Chemical Formulae 1 and 2) used in FIG. 6 is illustrated in FIG. 7. The reactivity of metallizing with TEIn varies depending on the type of the organic polymer. For example, when PMMA is metallized with TEIn, the film thickness after annealing (film thickness of the indium oxide) increases with an increase in film thickness after metallizing. When PNIPAM is used, the amount of increased film thickness after annealing is smaller than the amount of increased film thickness after metallizing. This also applies to a case where the styrene-based resin is used. Thus, the reactivity of metallizing with TEIn varies depending on the type of the organic polymer. Therefore, it is preferable that an annealing condition after metallizing, the film thickness after annealing, and the like be set in consideration of the type of the organic polymer.

Figure 8:
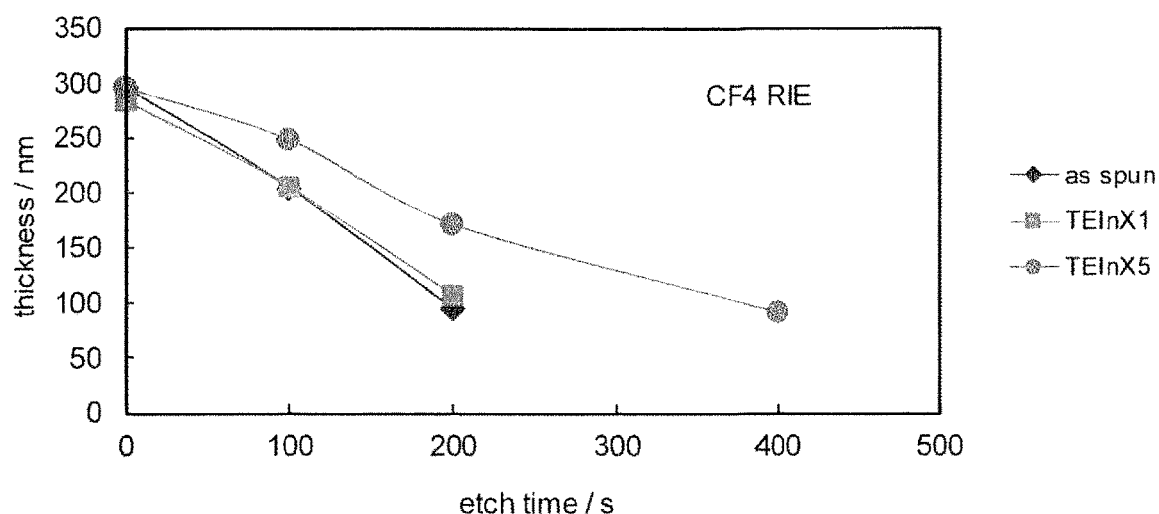
FIG. 8 is a graph illustrating a relationship between the etching time and the film thickness when a film obtained by metallizing PMMA as an organic polymer is etched.
Figure 9:
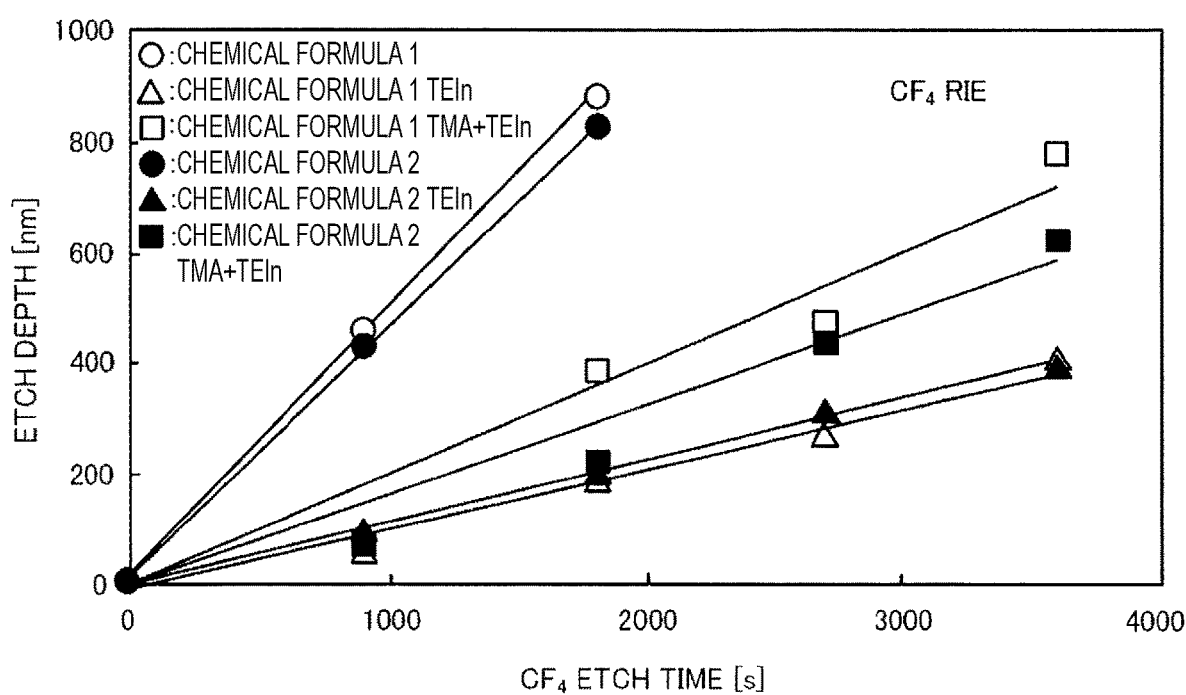
FIG. 9 is a view illustrating a relationship between the etching time and the film thickness when a film obtained by metallizing a styrene-based resin as an organic polymer is etched.

Next, the etching resistance of the organic polymer film metallized with TEIn will be described with reference to FIGS. 8, 9, and 10. FIG. 8 illustrates a relationship between the etching time and the film thickness when a PMMA film and the PMMA film that is metallized with TEIn are etched using a $CF_4$ gas. FIG. 9 illustrates a relationship between the etching time and the etching depth when films of the styrene-based resins (Chemical Formulae 1 and 2), the films the styrene-based resins that are metallized with TEIn alone, and the films the styrene-based resins that are metallized with TEIn and trimethylaluminum (TMA:$Al(CH_3)_3$) are etched using a $CF_4$ gas. It is seen that the $CF_4$ resistance is improved when the PMMA film and the films of styrene-based resins (Chemical Formulae 1 and 2) are metallized with TEIn, as illustrated in FIGS. 8 and 9. A comparison between the film metallized with TEIn alone and the film metallized with TEIn and TMA shows that the film metallized with TEIn alone has better resistance.

Figure 10:
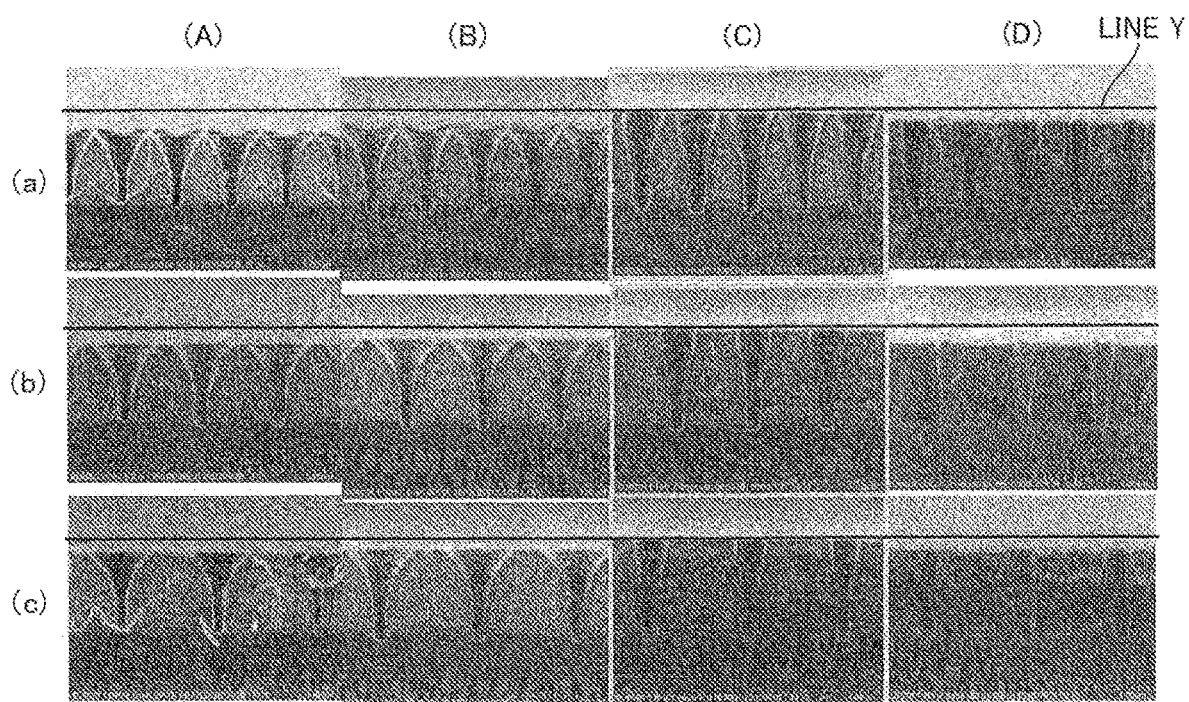
FIG. 10 is a SEM image illustrating a state where a film in which an organic polymer film is metallized under each of various types of conditions is etched.

FIG. 10 is a scanning electron microscope (SEM) image in a state where a film in which the film of the styrene-based resin (Chemical Formula 2) is metallized under each of various types of conditions is etched using a $C_4F_6$ gas. In FIG. 10, a row (A) illustrates a SEM image after etching of the film metallized with TMA, a row (B) illustrates a SEM image after etching of the film metallized with TMA and TEIn, a row (C) illustrates a SEM image after etching of the film metallized with TEIn, and a row (D) illustrates a SEM image after etching of a styrene-based resin film not metallized. In FIG. 10, a column (a) illustrates a SEM image of an organic polymer film in which holes with a diameter of 148 nm are formed at an interval of 500 nm, a column (b) illustrates a SEM image of a film in which holes with a diameter of 148 nm are formed at an interval of 700 nm, and a column (c) illustrates a SEM image of a film in which holes with a diameter of 148 nm are formed at an interval of 900 nm. It is shown that the retreat amount from a y line (etching amount) of the films metallized with TEIn of the row (C) is the smallest, and the films have excellent etching resistance by a $C_4F_6$, as illustrated in FIG. 10.

Figure 1B:
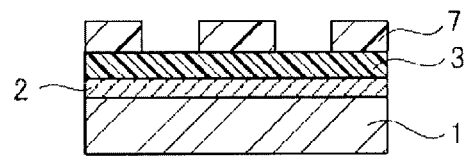

In the steps of the patterning method illustrated in FIGS. 1A to 1E, the aforementioned organic polymer film is formed on the film to be processed 2 as the etching mask 3, as illustrated in FIG. 1A. Subsequently, a resist pattern 7 is formed on the etching mask 3, as illustrated in FIG. 1B. The resist pattern 7 is formed by forming a resist film on the etching mask 3, and patterning the resist film by optical lithography, electron beam lithography, imprint lithography or the like. In the imprint lithography, a resist is dropped on the etching mask 3, a template having a fine pattern is pressed on the resist film, and the resist film is irradiated with ultraviolet light, resulting in curing, to form the resist pattern 7. The formed resist pattern 7 is subjected to metallizing described above.

Figure 1C:
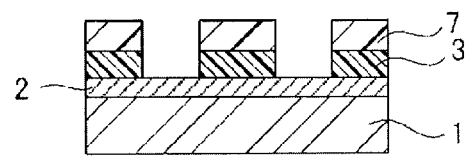
Figure 1D:
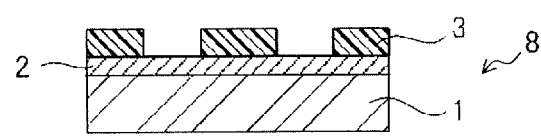

Subsequently, the etching mask 3 is etched by dry etching such as reactive ion etching (RIE) or ion beam etching (IBE) using the resist pattern 7 as a mask, resulting in patterning, as illustrated in FIG. 1C. FIG. 1C illustrates the patterned etching mask 3. When the difference in etching rates by an etching gas between the resist film and the etching mask 3 is small, a $SiO_x$ film and the like may be interposed between the resist film and the etching mask 3, and the etching mask 3 may be patterned by using the resist film and the $SiO_x$ film as masks. As illustrated in FIG. 1D, the resist pattern 7 is removed, and a step of infiltrating the organic In compound and a step of annealing the organic polymer film infiltrated with In are performed. A structure (patterned body) 8 having the etching mask 3 of the organic polymer film infiltrated with In on the film to be processed 2 is obtained.

Figure 1E:
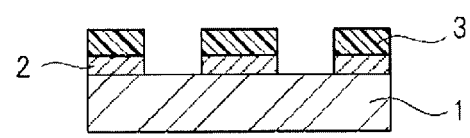

As illustrated in FIG. 1E, the patterned body 8 is used in patterning of the film to be processed 2. Specifically, the film to be processed 2 is exposed to an etching gas via the patterned etching mask 3, to achieve dry etching. Thus, the patterned film to be processed 2 is obtained. For the dry etching, for example, RIE, IBE, and the like are applied. As the etching gas, a gas containing a fluorine atom (F) is used. It is preferable that the etching gas contain fluorine (F) in a form of fluorocarbon having 1 to 6 carbon atoms ($C_nF_{2n+2}$, $C_nF_{2n}$, or $C_nF_{2n-2}$ wherein n is a number of 1 to 6). It is preferable that the etching gas further contain oxygen ($O_2$). In an etching gas containing a fluorine atom (F) and an oxygen atom (O), it is preferable that the amount of F be larger than the amount of O, rather than the ratio by atom of F to O of 1:1. Argon (Ar) and nitrogen ($N_2$) may be added, if necessary. In this case, Ar and $N_2$ are not involved in the ratio of a fluorine atom to an oxygen atom.

When the patterned film to be processed 2 using such an etching gas containing a fluorine atom (F) is formed, an enhancement in etching resistance to a F radical and the like of the etching mask 3 is desired. The In-infiltrating organic polymer film 5X formed by the method for manufacturing an In-containing organic polymer film of the embodiment and the annealed film 5Y thereof in response to the demand have excellent etching resistance to a F radical and the like. Therefore, the In-infiltrating organic polymer film 5X and the annealed film 5Y are suitable for a mask of dry etching such as RIE. Accordingly, the precision of the steps of the patterning method illustrated in FIGS. 1A to 1E and the subsequent etching step can be improved.

Method for Manufacturing Semiconductor Device

Figure 11A:
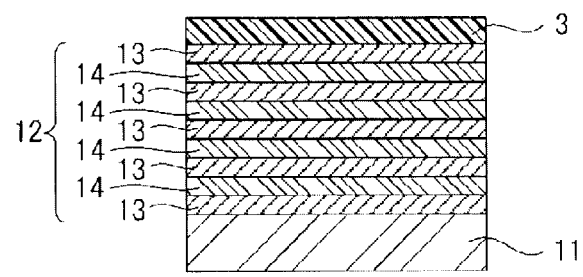
FIGS. 11A to 11E are views illustrating steps of a method for manufacturing a semiconductor device of at least one embodiment.

Next, a method for manufacturing a semiconductor device of the embodiment will be described with reference to FIGS. 11A to 11E. FIGS. 11A to 11E are cross-sectional views illustrating steps of the method for manufacturing a semiconductor device of at least one embodiment. In the method for manufacturing a semiconductor device illustrated in FIGS. 11A to 11E, a film 12 to be processed is formed on a semiconductor substrate 11 as illustrated in FIG. 11A. For example, the film 12 to be processed is a stacked film including a silicon nitride film 13 and a silicon oxide film 14 alternately stacked. For example, the stacked film 12 is used in manufacture of a three-dimensional nonvolatile memory device having a memory cell with a vertical transistor structure. On the film 12 to be processed that is such a stacked film, the etching mask 3 is formed by the steps of the patterning method of at least one embodiment. The etching mask 3 is the same as the etching mask used in the patterning method of at least one embodiment. That is, after an organic polymer film is formed on the stacked film 12, and patterned, metallizing, that is, infiltration with the alkylindium and oxidation of the etching mask 3 infiltrated with the alkylindium are performed. The film 12 to be processed is not limited to the stacked film including the silicon nitride film 13 and the silicon oxide film 14, and may be a single film of a silicon oxide film or a silicon nitride film.

Figure 11B:
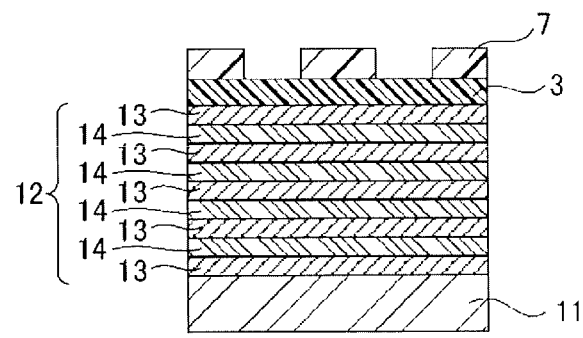
Figure 11C:
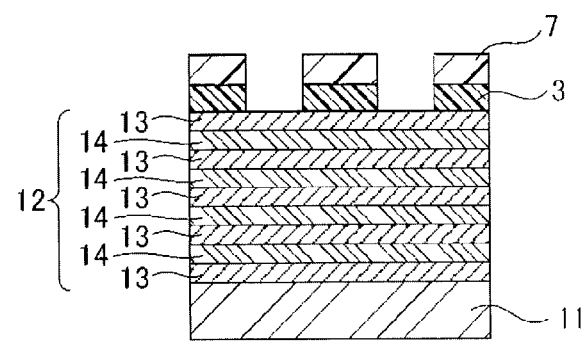
Figure 11D:
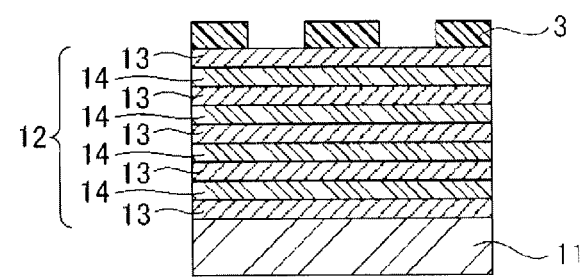

As illustrated in FIG. 11B, the resist pattern 7 is then formed on the etching mask 3. The resist pattern 7 is formed by patterning the resist film formed on the etching mask 3 by lithography, an imprint technique, or the like, in the same manner as in the patterning method of the embodiment. As illustrated in FIG. 11C, the etching mask 3 is then etched by dry etching using the resist pattern 7 as a mask, resulting in patterning. As illustrated in FIG. 11D, the resist pattern 7 is removed, and the film 12 to be processed is exposed to an etching gas via the patterned etching mask 3, to achieve dry etching. By such dry etching, the patterned film 12 to be processed is obtained as illustrated in FIG. 11E.

For the dry etching, RIE, IBE, and the like are applied. As the etching gas, a gas containing a fluorine atom (F) is used. It is preferable that the etching gas contain a fluorine atom (F) in a form of fluorocarbon having 1 to 6 carbon atoms ($C_nF_{2n+2n}$, $C_nF_2$, or $C_nF_{2n-2}$ wherein n is a number of 1 to 6). It is preferable that the etching gas further contain oxygen gas ($O_2$). In an etching gas containing a fluorine atom (F) and an oxygen atom (O), it is preferable that the amount of F be larger than the amount of O, rather than the ratio by atom of F to O of 1:1. By using such an etching gas containing fluorocarbon and the like, the film 12 to be processed such as the aforementioned stacked film can be effectively etched.

When as described in the patterning method of the embodiment, the etching mask 3 formed in the particular steps from the particular materials is used, high etching resistance can be achieved even in dry etching of the film 12 to be processed using the etching gas containing fluorocarbon and the like. Even when a pattern having a hole with a high aspect ratio is formed like the film 12 to be processed as illustrated in FIGS. 11A to 11E, the patterning precision of the film 12 to be processed can be enhanced. Thus, the precision of formation of a semiconductor device, the yield of manufacture of a semiconductor device, and the like can be improved. In the method for manufacturing a semiconductor device of the embodiment, the film 12 to be processed is not limited to the aforementioned stacked film, and a various types of films can be used.

Figure 11E:
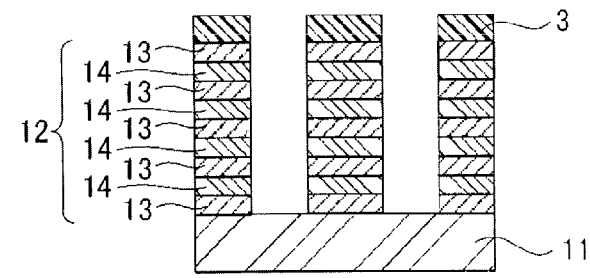

For example, the film 12 to be processed that is patterned as illustrated in FIG. 11E is used in manufacture of a memory cell array by a known method. For example, a hole pattern (memory hole) is formed in the stacked film by the aforementioned processing. In such a memory hole, a block insulating layer, a charge storage layer, a tunnel insulating layer, a channel layer, and a core layer are formed in order. Further, only a nitride film in the stacked film is removed via a slit formed separately from the memory hole, and a formed space is filled with a conductive film. As a result, a stacked film in which the insulating film (oxide film) and the conductive film are alternately stacked is obtained. Thus, a memory cell structure with a vertical transistor structure can be formed. The conductive film in the stacked film can function as a word line.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing an indium-containing organic polymer film comprising:
    forming an organic polymer film on a base body;
    infiltrating the organic polymer film with an alkylindium having an alkyl group having 2 to 4 carbon atoms; and
    oxidizing the organic polymer film infiltrated with the alkylindium.

2. The method for manufacturing an indium-containing organic polymer film according to claim 1,
    wherein the alkylindium is triethylindium.

3. The method for manufacturing an indium-containing organic polymer film according to claim 1,
    wherein the organic polymer film contains a monomer containing at least one selected from the group consisting of an ester group, an amido group, and an imido group in one segment.

4. The method for manufacturing an indium-containing organic polymer film according to claim 3,
    wherein the monomer in the organic polymer film further contains at least one aromatic ring in one segment.

5. The method for manufacturing an indium-containing organic polymer film according to claim 1,
    wherein the organic polymer film is exposed to the alkylindium at a temperature of 60° C. to 120° C.

6. A patterning method comprising:
    forming a pattern on an organic polymer film formed on a film to be processed;
    infiltrating the organic polymer film having the pattern with an alkylindium having an alkyl group having 2 to 4 carbon atoms;
    oxidizing the organic polymer film infiltrated with the alkylindium; and
    processing the film to be processed using the oxidized organic polymer film.

7. The patterning method according to claim 6,
    wherein the alkylindium is triethylindium.

8. The patterning method according to claim 6,
    wherein the organic polymer film contains a monomer containing at least one selected from the group consisting of an ester group, an amido group, and an imido group in one segment.

9. The patterning method according to claim 8,
    wherein the monomer in the organic polymer film further contains at least one aromatic ring in one segment.

10. The patterning method according to claim 6,
    wherein the organic polymer film is exposed to the alkylindium at a temperature of 60° C. to 120° C.

11. A method for manufacturing a semiconductor device comprising:
    preparing a semiconductor substrate having thereon a film to be processed;

forming an organic polymer film on the film to be processed;

forming a pattern on the organic polymer film;

infiltrating the organic polymer film having the pattern with an alkylindium having an alkyl group having 2 to 4 carbon atoms;

oxidizing the organic polymer film infiltrated with the alkylindium; and processing the film to be processed using the oxidized organic polymer film.

12. The method according to claim 11, wherein the alkylindium is triethylindium.

13. The method according to claim 11, wherein the organic polymer film contains a monomer containing at least one selected from the group consisting of an ester group, an amido group, and an imido group in one segment.

14. The method according to claim 13, wherein the monomer in the organic polymer film further contains at least one aromatic ring in one segment.

15. The method according to claim 11, wherein the organic polymer film is exposed to the alkylindium at a temperature of 60° C. to 120° C.

16. The method according to claim 11, wherein the film to be processed is a silicon oxide film or a stacked film including a silicon oxide film and a silicon nitride film.

17. The patterning method according to claim 6, wherein the processing the film to be processed includes etching the film to be processed with an etchant gas including fluorine.

18. The patterning method according to claim 17, wherein the etchant gas includes oxygen.

19. The method according to claim 11, wherein the processing the film to be processed includes etching the film to be processed with an etchant gas including fluorine.

20. The method according to claim 19, wherein the etchant gas includes oxygen.

* * * * *